(12) United States Patent
Seo et al.

(10) Patent No.: US 6,809,481 B2
(45) Date of Patent: Oct. 26, 2004

(54) LIGHT EMITTING DEVICE AND ELECTRIC DEVICE USING THE SAME

(75) Inventors: Satoshi Seo, Kanagawa (JP); Harue Nakashima, Kanagawa (JP); Shunpei Yamazaki, Tokyo (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 10/374,205

(22) Filed: Feb. 26, 2003

(65) Prior Publication Data

US 2004/0012026 A1 Jan. 22, 2004

(30) Foreign Application Priority Data

Feb. 28, 2002 (JP) .................................. 2002-054620

(51) Int. Cl.$^7$ ................................ G09G 3/20
(52) U.S. Cl. ....................... 315/169.1; 315/169.3; 345/76; 345/77
(58) Field of Search .................. 315/169.1, 169.3; 345/55, 76, 77

(56) References Cited

U.S. PATENT DOCUMENTS

| | | | |
|---|---|---|---|
| 5,552,678 A | 9/1996 | Tang et al. ............... | 315/169.3 |
| 6,686,898 B2 * | 2/2004 | Chen et al. ................ | 345/82 |

FOREIGN PATENT DOCUMENTS

| | | |
|---|---|---|
| EP | 1 094 436 | 4/2001 |
| JP | 6-301355 | * 10/1994 |
| JP | 8-180972 | 7/1996 |

OTHER PUBLICATIONS

Sato, Y., "Organic Molecules and Bioelectronics," The Japan Society of Applied Physics, vol. 11, No. 1, pp. 86–99, 2000; with partial English translation: (p. 95, line 1 through p. 96, line 7).

English Abstract re Japanese Patent Application No. JP 8–180972 published Jul. 12, 1996.

US patent application No. 09/692,753 (pending) to Koyama et al filed Oct. 19, 2000, including specification, abstract, claims, drawings and PTO filing receipt.

Van Slyke, S.A. et al, "Organic Electroluminescent Devices with Improved Stability," Appl. Phys. Lett., vol. 69, No. 15, pp. 2160–2162, Oct. 7, 1996.

Tang, C.W. et al, "Organic Electroluminescent Diodes," Appl. Phys. Lett., vol. 51, No. 12, pp. 913–915, Sep. 21, 1987.

* cited by examiner

*Primary Examiner*—David Vu
(74) *Attorney, Agent, or Firm*—Cook, Alex, McFarron, Manzo, Cummings & Mehler, Ltd.

(57) ABSTRACT

The purpose of the present invention is to provide a light emitting device using an organic light emitting element and allowed to be driven stably with long lifetime. In a light emitting device having an organic light emitting device provided with an organic compound layer for obtaining light emission by applying a voltage between a first electrode and a second electrode, and arrangements for applying a forward bias for emitting light from the organic light emitting device and a reverse bias of reverse polarity to the forward bias, the maximum voltage Vf of the forward bias is higher than the maximum voltage Vr of the reverse bias in an alternating current cycle formed of the forward bias and the reverse bias. At this time, the Vr is preferably a quarter of the Vf or higher than that. Additionally, the time Tr to apply the reverse bias in the alternating current cycle is preferably equal to or longer than the time Tf to apply the forward bias.

20 Claims, 7 Drawing Sheets

LIGHT EMITTING DEVICE AND ELECTRIC DEVICE USING THE SAME

BACKGROUND OF THE INVENTION

1. Filed of the Invention

The present invention relates to an organic light emitting device having an anode, a cathode, and a layer containing organic compounds in which luminescence can be obtained by applying an electronic field (hereafter referred to as organic compound layer). The present invention particularly relates to an organic light emitting element having a longer drive life than that of conventional ones, and a light emitting device using the organic light emitting element.

2. Description of the Related Art

An organic light emitting element is an element which emits light when an electronic field is applied. A luminescence mechanism thereof has been said: applying a voltage to an organic compound layer interposed between electrodes, electrons injected from a cathode and positive holes injected from an anode recombine together at a center of luminescence in the organic compound layer to form excited molecules; energy is released and light is emitted when the molecule excitons returne to the base state.

In addition, kinds of molecule excitons formed by the organic compound can include a singlet excited state and a triplet excited state, while the specification of the present invention contains the case where either of the excited states contributes to luminescence.

In such organic light emitting device, an organic compound layer is normally formed in a thin film below 1 $\mu$m in thickness. Also, since the organic light emitting device is a self-luminescent type one, in which the organic compound layer itself emits light, a backlight used in a conventional liquid crystal display is not necessary. Accordingly, the organic light emitting device can be very advantageously formed to be thin and lightweight.

Also, with, for example, an organic compound layer of about 100 to 200 nm in thickness, a time period having elapsed from injecting of a carrier to recombination thereof is in the order of several tens of nanosecond taking account of the extent of movement of the carrier in the organic compound layer, and luminescence is achieved in the order of less than one micro second even when the procedure from the recombination of the carrier to luminescence is included. Accordingly, one of the features is that the speed of response is very quick.

Further, since the organic light emitting device is a carrier-injecting type light emitting device, it can be driven by DC voltage, and is hard to generate noise. With respect to drive voltage, an adequate luminance of 100 cd/m$^2$ is achieved at 5.5 V by first making the thickness of an organic compound layer a uniform, super-thin film of around 100 nm in thickness, selecting an electrode material, which reduces a carrier injection barrier with respect to the organic compound layer, and further introducing a single hetero structure (double structure) (Reference 1: C. W. Tang and S. A. VanSlyke, "Organic electroluminescent diodes", Applied Physics Letters, vol. 51, No. 12, 913–915 (1987)).

Owing to such performances as thin and lightweight, high-speed response, DC low voltage drive, and the like, organic light emitting devices have been given attention as next-generation flat panel display devices. Also, since organic light emitting devices are of self-luminescent type and wide in angle of visibility, they are comparatively favorable in visibility and believed to be effective as devices used for displays in portable devices.

However, the reliability of the device can be a major problem of such a light emitting device. With respect to the reliability, the luminance being deteriorated over time is a particularly conspicuous problem, and a considerable improvement is needed. Further, being a super thin film device, defects such as short circuits of the device caused by the morphology, point defect or unevenness of the thin film must be prevented.

It can be considered that the luminance being deteriorated over time is a phenomenon basically caused by the materials, however, it is possible to prolong the half-life of luminance by driving methods of the device. For example, there is an example that the half-life of luminance being deteriorated over time has been improved dramatically by inserting copper phthalocyanine as a hole injecting layer, and employing a rectangular wave alternating current drive (constant currents in forward biases, constant voltages in reverse biases) instead of a direct current drive (Reference 2: S. A. Van Slyke, C. H. Chen, and C. W. Tang, "Organic Electroluminescent Devices with Improved Stability", Appl. Phys. Lett., 69 (15), 2160–2162 (1996)).

According to reference 2, the luminance half-life at initial luminance 510 cd/m$^2$ can be prolonged to 4000 hours. As factors thereof, an excellent positive hole injecting characteristic of copper phthalocyanine which is a positive hole transportation layer, a superior heat-resistance of NPB which is a positive hole transportation layer, and a capability of excluding the accumulation of space charges by an alternating current drive can be given. In addition, normally, when the organic light emitting element is driven by a constant current, a drive voltage rises gradually along with the luminance deterioration, however, the rises of the drive voltage can be suppressed by the alternating current drive.

It has been reported that defects such as short circuits of the device caused by the morphology and point defects can be removed by such alternating current drive (Reference 3: Japanese Patent Laid-Open No. 08-180972). Reference 3 has pointed that the short circuits present frequently in a short period (200 to 300 hours) in the case of direct current drive as a result of comparing the lifetimes of the alternating current drive and the direct current drive.

Further, as techniques for preventing the short circuits of the element caused by unevenness of an electrode, a technique such as providing a buffer layer comprising a conductive polymer on the electrode is devised (Reference 4: Yoshiharu Sato, Organic Molecules and Bioelectronics (The Japan Society of Applied Physics, Vol. 11, No. 1 (2000), p. 86–99). Reference 4 has mentioned that by introducing an anode buffer layer of polymer, the surface unevenness of ITO which is an anode can be smoothed, thereby leads to the reduction of the defects of short circuits.

As described above, in order to improve the reliability of the organic light emitting element, techniques can be implemented not only from the viewpoint of improvements of materials, but from the viewpoint of the drive methods and the structure of the element.

The alternating current drive described in the document 3 is characterized in that the voltage applied to the device in reverse bias (hereafter, it is denoted by Vr) is equal to or greater than the voltage applied to the device in forward bias (hereafter, it is denoted by Vf) and the time for duration in reverse bias (hereafter, it is denoted by Tr) is shorter than the time for duration in forward bias (hereafter, it is denoted by Tf). More specifically, Vf$\leq$Vr and Tf>Tr. Here, the voltages shown here are all handled as positive values.

Considering the effect that the reverse bias eliminates the accumulation of space charges, $Vf \leq Vr$ is more effective. However, in this case, it is necessary to take into account of the dielectric breakdown strength of the element. In short, Vr has to be set smaller than the dielectric breakdown voltage Vb. That is, $Vf \leq Vr < Vb$.

However, when the luminance is being reduced over time, the current efficiency (the ratio of the luminance to the current density) itself is being reduced compared with the initial driving period. In other words, since the leakage current not contributing to light emission is increased, it is likely to destroy the element by dielectric breakdown with the voltage smaller than Vb in the long term.

That is, in the case of the alternating current drive method, the half-life of luminance is prolonged more than that by direct current, and short circuits generated in the initial driving period can be prevented. However, in the long view, the possibility of dielectric breakdown emerges even in the reverse bias voltage Vr where the element was not supposed to be destroyed by dielectric breakdown in the initial driving period.

SUMMARY OF THE INVENTION

Then, the object of the invention is to improve the alternating current drive method of the organic light emitting element capable of relaxing the luminance deterioration and preventing short circuits in the initial driving period more than before and to prevent the device from being destroyed by dielectric breakdown in a long term. In addition, the object is to provide a light emitting device with reduced luminance deterioration and excellent yields by combining the alternating current drive means and the organic light emitting element.

Moreover, the object is to provide an electric device excellent in long time reliability more than before by manufacturing the electric device with the use of the light emitting device.

The invention is characterized by a light emitting device having:

- an organic light emitting element provided with an organic compound layer for obtaining light emission by applying a voltage between a first electrode and a second electrode; and
- means for applying a forward bias for emitting light from the organic light emitting device and a reverse bias of reverse polarity to the forward bias,
- wherein a maximum voltage Vf of the forward bias is greater than a maximum voltage Vr of the reverse bias in an alternating current cycle formed of the forward bias and the reverse bias. At this time, the Vr is preferably a quarter of the Vf or greater.

In addition, a period of time to apply the reverse bias in the alternating current cycle is preferably equal to or longer than a period of time to apply the forward bias. In this case, an amount of light emission becomes small and a period of time for light emission is shortened. Thus, the organic light emitting device for use preferably produces light emission from the triplet excited state. Alternatively, light emission is preferably produced from a rare-earth metal ion.

Here, current is hardly carried in reverse bias, and thus it is acceptable to apply a certain fixed voltage for the reverse bias. As for the forward bias, a fixed voltage is acceptable, but the drive to carry a constant current is more preferable.

Accordingly, the invention is characterized in that both the forward bias and the reverse bias are applied so that a fixed voltage is applied to the organic light emitting element.

Furthermore, the invention is characterized in that the forward bias is applied so that a fixed current is carried through the organic light emitting device and the reverse bias is applied so that a fixed voltage is applied to the organic light emitting element.

In the meantime, as the organic compound layer in the invention, a polymer compound is preferably used. Then, the invention is characterized in that the organic compound layer contains a polymer compound for producing light emission.

Moreover, in the invention, a layer having a certain level of conductivity is preferably disposed between the organic compound layer and the electrode.

Accordingly, the invention is characterized in that a conductive layer containing an inorganic compound is disposed between the organic compound layer and the first electrode, or between the organic compound layer and the second electrode. In this case, the conductivity of the conductive layer containing the inorganic compound is preferably $10^{-10}$ S/cm or greater.

Besides, the invention is characterized in that a layer containing a conductive polymer compound is disposed between the organic compound layer and the first electrode, or between the organic compound layer and the second electrode. Particularly, in view of improving the conductivity, the layer containing the conductive polymer compound preferably further has an acceptor or a donor for the conductive polymer. Also in this case, the conductivity of the layer containing the conductive polymer compound is preferably $10^{-10}$ S/cm or greater.

In addition, the invention is characterized in that a layer containing a pi-conjugated organic compound is disposed between the organic compound layer and the first electrode, or between the organic compound layer and the second electrode. Particularly, in view of improving the conductivity, the layer containing the Π-conjugated organic compound preferably further has an acceptor or a donor for the Π-conjugated organic compound. Also in this case, the conductivity of the layer containing the Π-conjugated organic compound is preferably $10^{-10}$ S/cm or greater.

Therefore, the light emitting element described above is used to manufacture an electric device, which can provide an electric device more durable than before. Accordingly, the invention includes an electric device using the light emitting element according to the invention.

The light emitting device in the invention is an image display device or a light emitting device using the organic light emitting element as a light emitting element. In addition, a module in which an organic light emitting element is mounted with a connector, such as a FPC (Flexible Printed Circuit), TAB (Tape Automated Bonding) tape or TCP (Tape Carrier Package), a module in which a printed wiring board is mounted on the tip of a TAB tape or a TCP, or a module in which an organic light emitting element is directly mounted with an IC (Integrated Circuit) by COG (Chip On Glass) method is all considered to be included in the light emitting device.

BRIEF DESCRIPTION OF THE DRAWINGS

The teachings of the invention can be readily understood by considering the following detailed description in conjunction with the accompanying drawings.

DESCRIPTION OF THE PREFERRED EMBODIMENT

Hereafter, the embodiment mode of the invention will be described. In the organic light emitting element, it is fine that at least one of the first electrode and the second electrode is transparent for light emission. However, the device structure is general in which a transparent first electrode is formed over a substrate and light is emitted from the first electrode (anode). In fact, the structure in which the first electrode is formed to be a cathode in reverse and light is emitted from the cathode, and the structure in which light is emitted from the opposite side of the substrate are also applicable.

Figure 1A:
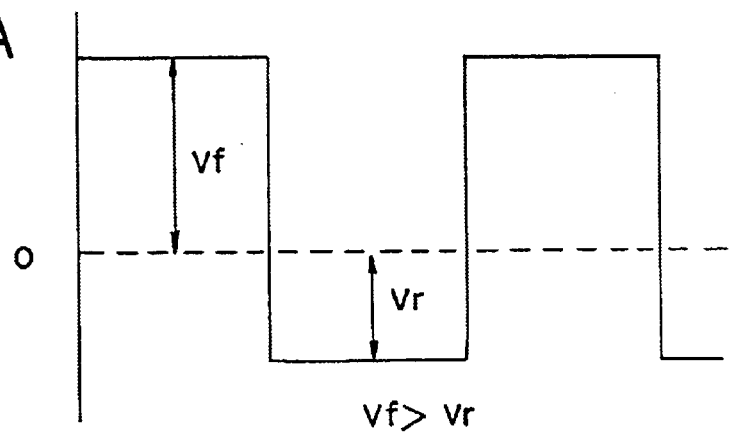
FIGS. 1A and 1B are diagrams illustrating the concept of the driving method of the invention.
Figure 1B:
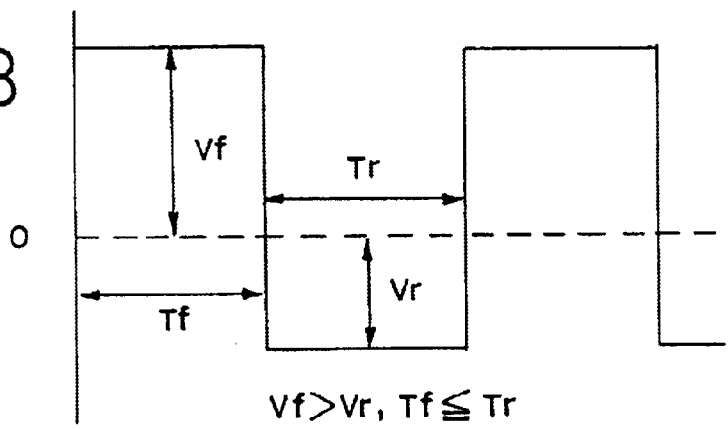

First, FIGS. 1A and 1B show the outline of the driving method used in the invention. FIG. 1A shows the driving method of the invention in which when a forward bias for allowing an organic light emitting element to emit light and a reverse bias of reverse polarity to the forward bias are applied, the maximum voltage of the forward bias (that is, Vf) is greater than the maximum voltage of the reverse bias (that is, Vr) in the alternating current cycle formed of the forward bias and the reverse bias. The duty ratio is set to 50% here, but actually any values are acceptable as long as images can be displayed.

When the organic light emitting device emits light in forward bias (voltage Vf), the organic light emitting element will not be destroyed by a dielectric breakdown (when it is destroyed by dielectric breakdown, it cannot emit light). That is, the possibility to produce dielectric breakdown in reverse bias will be extremely small in the long view as long as the voltage of the reverse bias Vr is set smaller than Vf. More specifically, it is fine that the maximum voltage Vr of reverse bias is set to a quarter of the maximum voltage Vf of forward bias or greater.

In addition, the inventor found that the lifetime is to be improved by reverse bias sufficiently even in the state of Vf>Vr. Particularly, it is confirmed that the lifetime is improved sufficiently when Vf>Vr≧¼Vf.

Moreover, in order to sufficiently take advantage of the effect of improving the lifetime by reverse bias under the condition of Vf>Vr, the time Tr to apply a reverse bias is preferably equal to or longer than the time Tf (that is, Tf≦Tr). FIG. 1B shows the state. In FIG. 1B, Tf=Tr.

When Tf is equal to or shorter than Tr, the period to emit light becomes shorter. Thus, the luminance is generally considered to reduce. However, it is unlikely to drop the luminance so much.

Figure 2:
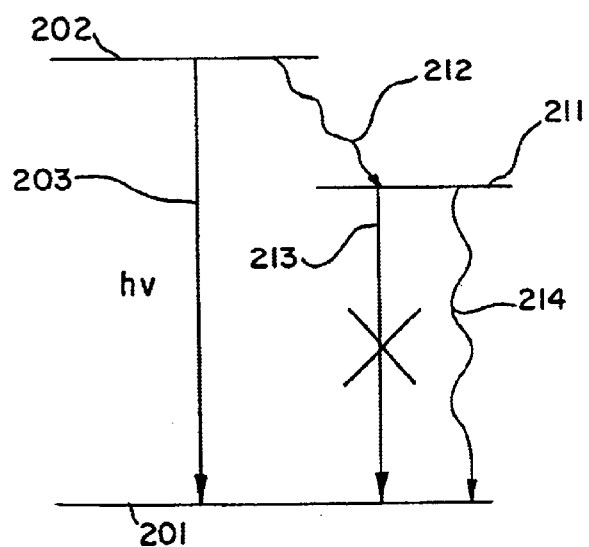
FIG. 2 is a diagram illustrating the process of light emission.

FIG. 2 is used to explain the reason. FIG. 2 is a diagram illustrating the energy level. 201 denotes the highest occupied molecular orbital (HOMO) of a luminous body (here, it is supposedly a fluorescent material), and 202 denotes the lowest unoccupied molecular orbital (LUMO) of the luminous body. In this case, when the luminous body is extremely pure, molecules in the excited state emit energy in the condition of an emission 203 in the probability of fluorescence quantum yield D (the rest is thermally deactivated or undergoes intersystem crossing).

However, when there is an impurity or a morphological defect, carriers are trapped at an impurity level 211 thereof, or the luminous body 202 produces an energy transfer 212. Then, an emission 213 is not produced from the impurity level 211, and it undergoes a deactivation 214 with no emission.

However, because of the implementation of the alternating current drive in the invention, it is likely to prevent energy from transferring to the impurity level 211 due to the impurity or the morphological defect and to produce the emission 203 from the luminous body more than direct current drive does. Therefore, problems will not occur even Tf≦Tr as long as images can be displayed.

In addition, as a technique of producing much light emission even in the state of Tf≦Tr, the method is considered to apply an organic light emitting device that produces light emission from the triplet excited state (hereafter, it is denoted by triplet light emitting element).

The light emission (phosphorescence) from the triplet excited state has the deterioration lifetime of light emission longer than that of the light emission (fluorescence) from the singlet excited state (more specifically, the deterioration half-life is a few nanoseconds in fluorescence, whereas phosphorescence of a phosphorescent material applied to the organic light emitting devices ranges from a few hundreds nanoseconds to a few microseconds). Therefore, an afterglow can be utilized even though Tf is small. The triplet light emitting device has current efficiency higher than that of the singlet light emitting device, and thus it can produce sufficient light emission even though Tf is small.

When a complex having a rare-earth metal ion is used for a luminous body, which emits light from the triplet excited state, the deterioration half-life is on the order of a few milliseconds. Accordingly, the organic light emitting element producing light emission from the rare-earth metal ion is also preferable.

In the meantime, when the organic light emitting element is driven by direct current drive, there are the constant voltage drive to apply a fixed voltage to the organic light emitting element and the constant current drive to carry a constant current. It is acceptable to apply those methods to the alternating current drive in the invention. More specifically, since current is rarely carried in reverse bias, it is fine to apply a fixed voltage for the reverse bias. For forward bias, either a fixed voltage or a constant current is acceptable. From the viewpoint of element lifetime, a constant current is considered to be more preferable. From the viewpoint of preventing defects such as short circuits in the long view, a fixed voltage is preferable.

Next, for the organic light emitting element applicable to the invention, any organic light emitting devices are fine as long as they are the organic light emitting device provided with an organic compound layer for obtaining light emission by applying a voltage between the first electrode and the second electrode as traditionally used. Any emission colors are acceptable. When a full color display device is fabricated, these methods are known: the method of combining three primary colors of light (blue, red and green), the method of combining a color filter with a white organic light emitting element, and the method of combining a color conversion layer with a blue organic light emitting element.

Particularly in the invention, the organic compound layer is preferably formed of a polymer compound. When the drive in the invention is implemented, it is considered to need Vf higher than that in the direct current drive depending on the circumstances. However, the organic light emitting device using a polymer compound is driven by low driving voltage, and thus it can produce light emission by much lower voltage, being useful. Since it is driven by low driving voltage, stress applied to the device can be reduced. Therefore, the combination of the device with the alternating current drive in the invention will further exert the advantage of improved lifetime.

In that sense, as a technique to lower the driving voltage, a layer having a certain level of conductivity is preferably disposed between the organic compound layer and the electrode. In this case, the effect of efficiently eliminating the accumulation of space charges is also expected from disposing the layer having conductivity. Either inorganic compounds or organic compounds are acceptable for this layer, but organic compounds are preferable in view of adhesion.

When an inorganic compound is used for the layer having conductivity, titanium nitride and calcium nitride are named, for example. Titanium nitride has a high work function, which is preferably applied to the anode side. In reverse, calcium nitride is preferably applied to the cathode side.

When an organic compound is used for the layer having conductivity, a technique to apply conductive polymer compounds is considered. Particularly in view of improving conductivity, compounds added with an acceptor or a donor are preferable. For example, polyaniline and PEDOT/PSS of polystyrene sulfonate added in polyethylene dioxythiophene are named, which are water-soluble conductive polymers. They are p-type semiconductors, thus being applied to the anode side.

In addition, monomolecular Π-conjugated organic compounds are applicable. Also in this case, in view of improving conductivity, compounds added with an acceptor or a donor are preferable. For instance, it is acceptable that various carrier transport materials used in the organic light emitting elements as the monomolecular Π-conjugated organic compounds are used and an acceptor or a donor is added by coevaporation.

Furthermore, the conductivity of the layer having conductivity described above is preferably equal to or higher than that of the border between the insulator and the semiconductor in view of eliminating the accumulation of space charges, more specifically, $10^{-10}$ S/cm or greater.

It is fine that the alternating current drive means is combined with these organic light emitting elements to fabricate a light emitting device. As the light emitting device, the applications are broad such as a lighting utilizing simple plane emission, or a display device with pixels arranged in a matrix.

Figure 3:
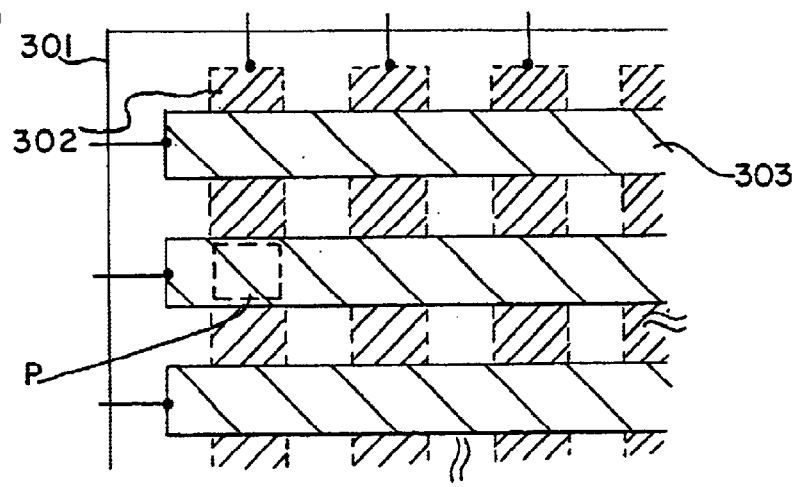
FIG. 3 is a diagram illustrating the concept of a passive matrix display device.
Figure 4:
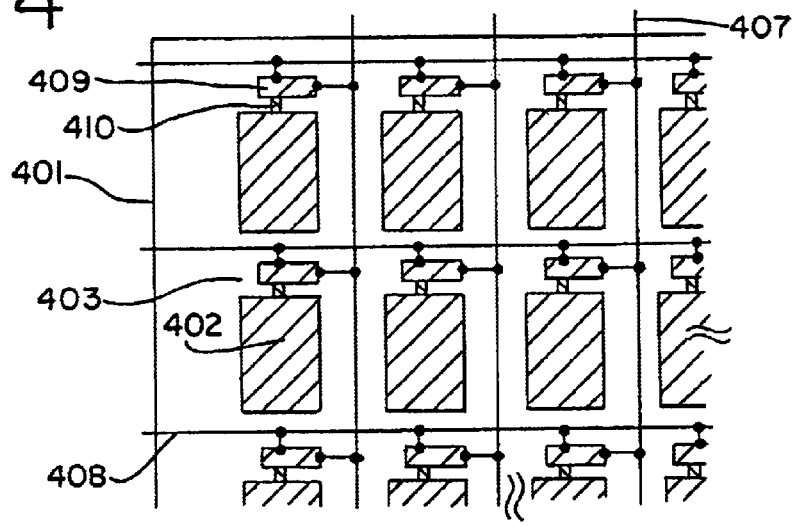
FIG. 4 is a diagram illustrating the concept of an active matrix display device.

In the case of the display device with pixels arranged in a matrix, a passive matrix type and an active matrix type can be considered. FIGS. 3 and 4 show the conceptual diagrams.

FIG. 3 is the conceptual diagram of the passive matrix type. FIG. 3 is a top view. More specifically, a stripe first electrode 302 is formed on a substrate 301, an organic compound layer is formed thereon, and a second electrode 303 is further formed thereon as orthogonal to the first electrodes. The crossing part is a pixel P. In driving, a forward bias and a reverse bias are applied between the first electrode 302 and the second electrode 303 for alternating current drive.

FIG. 4 is the conceptual diagram of the active matrix type. FIG. 4 is a top view. More specifically, an island-like first electrode 402 is formed over a substrate 401, and a partitioning wall 403 including an insulator is formed to project upward from the first electrode 402 and to surround a pixel part. An organic compound layer is formed thereon, and a second electrode is formed in contact further thereon.

In addition, a non-linear element 409 connected to a data signal line 407, a scan signal line 408, a data signal line 407, and a scan signal line 408 are disposed. The non-linear element is connected to the first electrode 402 through a contact 410. Accordingly, each pixel can be switched independently. Typically, the non-linear element 409 is formed of the combination of thin film transistors connected each other and a capacitor, or the combination of a thin film transistor and a parasitic capacitor of the thin film transistor. In driving, a forward bias and a reverse bias are applied between the first electrode 402 and the second electrode for alternating current drive.

EMBODIMENTS

Embodiment 1

In the embodiment, in a organic light emitting element in which a polymer compound producing light emission was applied as an organic compound layer and a layer including a conductive polymer compound was disposed between an anode and the organic compound layer, luminance deterioration was measured in the constant voltage alternating current drive (the drive in which both the forward bias and the reverse bias are set to a fixed voltage).

Figure 5:
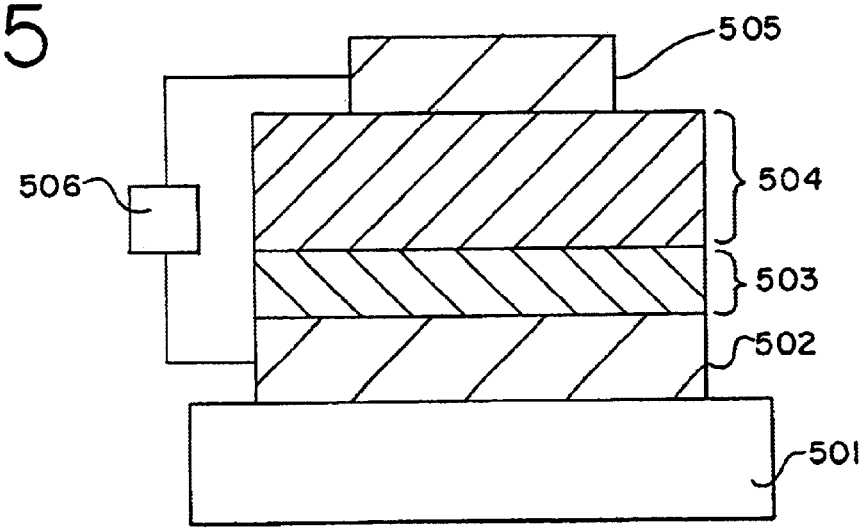
FIG. 5 is a diagram illustrating the structure of an organic light emitting element.

FIG. 5 shows a device structure. First, an aqueous solution of 1.3 wt % of PEDOT/PSS was applied to a glass substrate 501 deposited with ITO of a thickness of 110 nm as an anode 502, and the substrate was baked at a temperature of 100° C. for one hour to form a layer 503 containing a conductive polymer compound. The film thickness was formed to be about 30 nm.

Subsequently, the substrate was vacuum-baked at a temperature of 80° C. for three minutes, and a toluene solution of 0.16 g of poly(p-phenylene vinylene) derivative producing yellow light emission dissolved in 40 ml of toluene was applied, and the substrate was heated and dried to form an organic compound layer 504 (in this case, only a light emitting layer). The film thickness was formed to be about 80 nm.

Furthermore, under a vacuum of $10^{-4}$ Pa, Ca was deposited in a thickness of 20 nm, and then Al was deposited in a thickness of 200 nm to form a cathode 505. Subsequently, the substrate was bonded to an opposite glass coated with a UV curable resin, and ultraviolet rays were irradiated for sealing.

Figure 6:
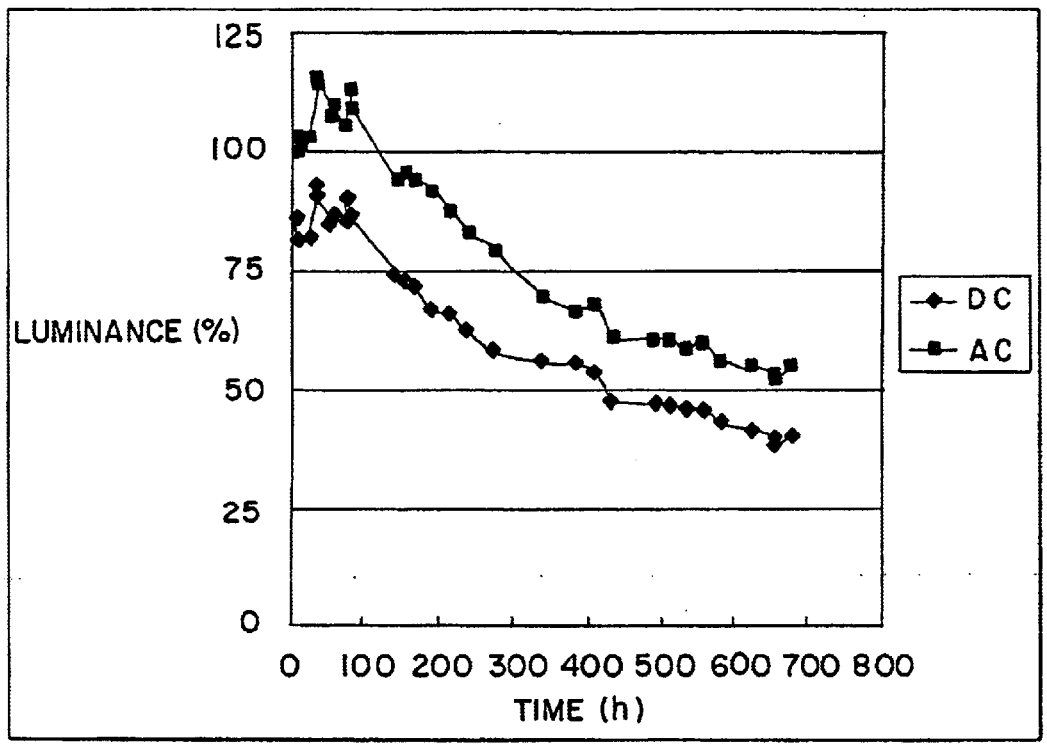
FIG. 6 is a diagram illustrating the results of Embodiment 1 and Comparative example 1.

A reliability test was conducted on this device in the constant voltage alternating current drive by a alternator 506, where a forward bias was 3.7 [V], a reverse bias was 1.7 [V], a duty ratio was 50%, and a frequency was 60 Hz (the initial luminance was about 400 cd/cm²). The result is shown by Plot AC in FIG. 6. The luminance did not reach the half-life even after about 700 hours passed.

COMPARATIVE EXAMPLE 1

For comparison, a reliability test was conducted on the same device as Embodiment 1 in the constant voltage direct current drive where the initial luminance was set to about 400 cd/cm² as similar to Embodiment 1 (the driving voltage was 3.65 [V]). The result is shown by Plot DC in FIG. 6. The luminance reached the half-life after a little over about 400 hours.

As compared with AC, it is revealed that the initial deterioration is particularly remarkable in the constant voltage drive. Moreover, the conditions for driving the devices of Embodiment 1 and Comparative example 1 were summarized in Table 1 below.

TABLE 1

| | initial luminance: 400 cd/cm$^2$ | |
| --- | --- | --- |
| | Embodiment 1 | Comparative example 1 |
| forward bias | 3.7 [V] | 3.65 [V] |
| reverse bias | −1.7 [V] | — |
| duty ratio | 50:50 | — |
| frequency | 60 Hz | — |

Embodiment 2

Figure 7:
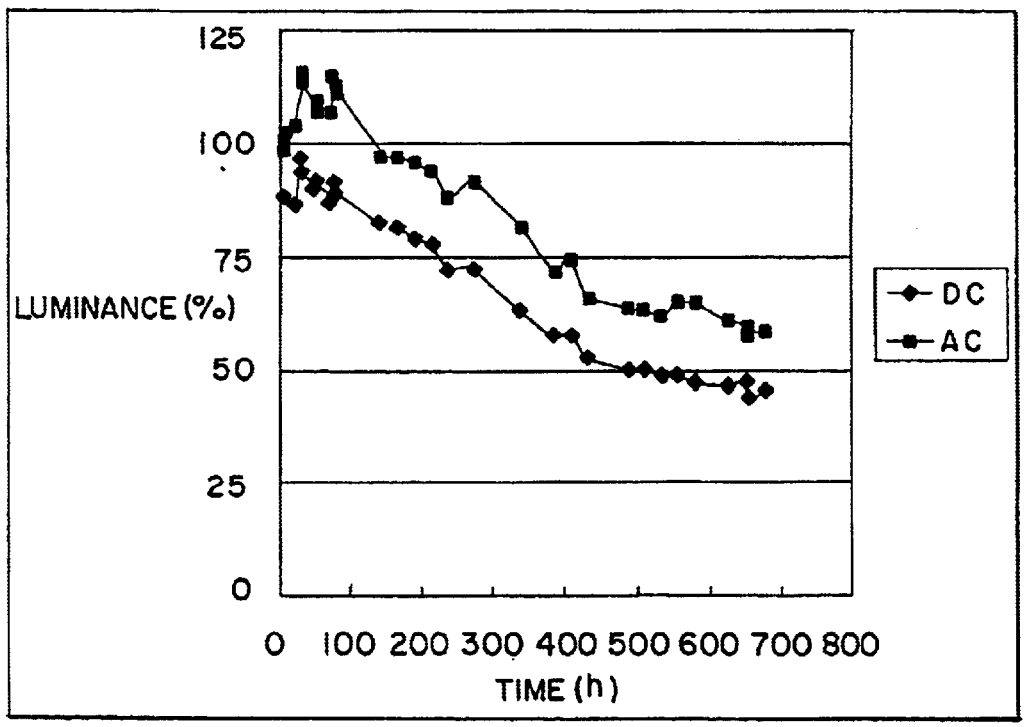
FIG. 7 is a diagram illustrating the results of Embodiment 2 and Comparative example 2.

In this embodiment, the same device as Embodiment 1 was fabricated, and the reliability of the device was measured as the driving conditions were slightly varied. The constant voltage alternating current drive was performed where a forward bias was 3.8 [V], a reverse bias was 1.4 [V], a duty ratio was 50%, and a frequency was 600 Hz (the initial luminance at this time was about 300 cd/cm$^2$). The result is shown by Plot AC in FIG. 7. About 60% of the initial luminance was maintained even after about 700 hours passed.

COMPARATIVE EXAMPLE 2

For comparison, a reliability test was conducted on the same device as Embodiment 2 in the constant voltage direct current drive where the initial luminance was set to about 300 cd/cm$^2$ as similar to Embodiment 2 (the driving voltage at this time was 3.65 [V]). The result is shown by Plot DC in FIG. 7. The luminance reached the half-life after about 500 hours.

As compared with AC, it is revealed that the initial deterioration is particularly remarkable in the constant voltage drive. Besides, the conditions for driving the devices of Embodiment 2 and Comparative example 2 were summarized in Table 2 below.

TABLE 2

| | initial luminance: 300 cd/cm$^2$ | |
| --- | --- | --- |
| | Embodiment 2 | Comparative example 2 |
| forward bias | 3.8 [V] | 3.65 [V] |
| reverse bias | −1.4 [V] | — |
| duty ratio | 50:50 | — |
| frequency | 600 Hz | — |

Embodiment 3

Figure 8A:
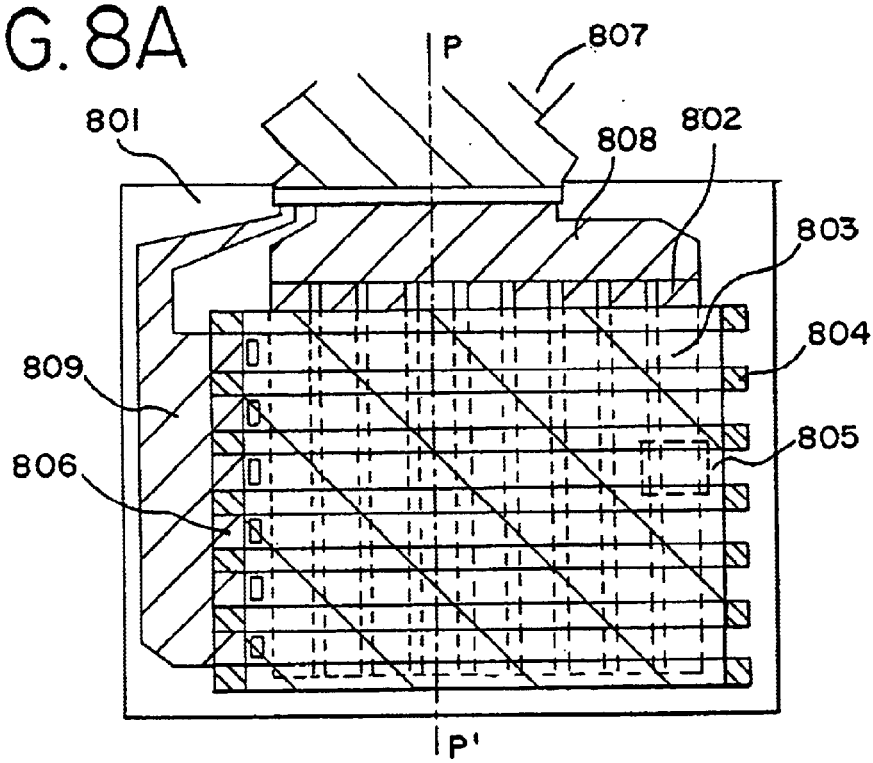
FIGS. 8A to 8C are diagrams illustrating the structure of a light emitting device.
Figure 8B:
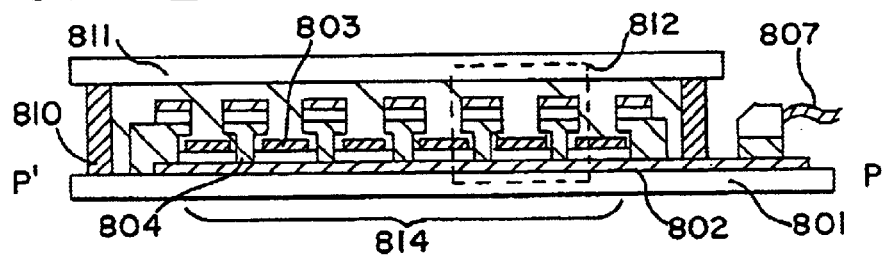

An example of a passive matrix light emitting device is shown in Embodiment 3 as an example of a light emitting device disclosed by the present invention. A top view thereof is shown in FIG. 8A, and a cross sectional diagram of FIG. 8A cut along a line P-P' is shown in FIG. 8B. In addition, element structures of the organic light emitting element can be various, the compositions such as ones shown in Embodiments 2 and 3 may be adapted.

Reference numeral 801 denotes a substrate in FIG. 8A, and glass is used for the substrate here. A plastic material also can be used, as the plastic material, polyimide, polyamide, acrylic resin, epoxy resin, PES (polyether sulfile), PC (polycarbonate), PET (polyethylene terephthalate), or PEN (polyethylene naphthalate), which are in a plate shape, or a film shape can be used.

Reference numeral 802 denotes a scanning line (anode) made from an oxide conductive film, and an indium tin oxide (ITO) is used in Embodiment 3. Further, reference numeral 803 denotes a data line (cathode) including a metallic film, one formed by laminating barium fluoride and aluminum is used in Embodiment 3. Reference numeral 804 denotes a bank made from an acrylic resin, and the banks 804 function as partitioning walls for separating the data lines 803. Pluralities of both the scanning lines 802 and the data lines 803 are formed in a stripe manner, and the scanning lines 802 and the data lines 803 are formed so as to mutually intersect at right angles. Note that, although not shown in the FIG. 8A, organic compound layers are sandwiched between the scanning lines 802 and the data lines 803, and intersecting portions 805 become pixels.

The scanning lines 802 and the data lines 803 are connected to an external driver circuit through a TAB tape 807. Note that reference numeral 808 denotes a wiring group in which the scanning lines 802 are aggregated, and that reference numeral 809 denotes a wiring group in which connection wirings 806 connected to the data lines 803 are aggregated. Further, although not shown in the figures, a TCP in which an IC is formed in a TAB tape may also be connected instead of the TAB tape 807.

Reference numeral 810 denotes a sealant in FIG. 8B, and reference numeral 811 denotes a cover material bonded to the plastic substrate 801 by the sealant 810. A radiation-cured resin may be used as the sealant 810, and it is preferable to use a material having little outgassing and a low hygroscopicity. It is preferable to use the same material as that of the substrate 801 for the cover material, and glass (including quartz glass) or a plastic can be used. Here used is glass.

Figure 8C:
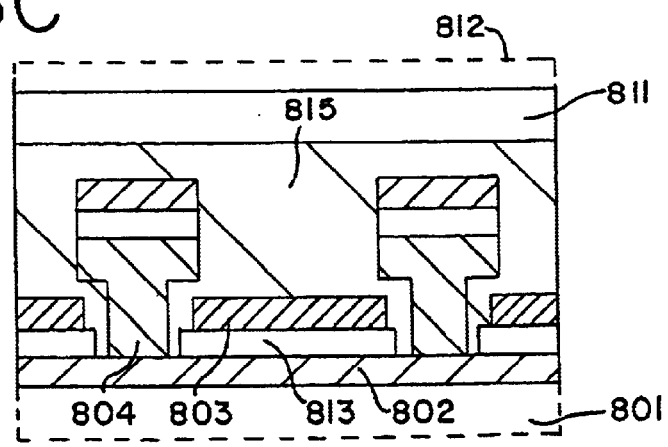

An enlarged diagram of the structure of a pixel region 812 is shown in FIG. 8C. Reference numeral 813 denotes an organic compound layer. Note that, as shown in FIG. 8C, the banks 804 have a shape in which the width of the lower side is narrower than the width of the upper side, and the data lines 803 are physically separated. Further, a pixel portion 814 enclosed by the sealant 810 is cut off from the atmosphere by a sealing material 815 made from a resin, thus forming a structure in which deterioration of the organic compound layers is prevented.

The pixel portion 814 is formed by the scanning lines 802, the data lines 803, the banks 804, and the organic compound layer 813 in the light emitting devices of the present invention made from the aforementioned structure, and therefore the manufacturing processes can be made extremely simple.

Further, a polarization plate may also be formed on a display surface (a surface in which an image is observed) of the light emitting device according to Embodiment 3. The polarization plate controls reflection of light incident from the outside, and is effective in preventing a user's own image from being projected onto the display surface. A circular polarization plate is generally used. However, it is preferable to use a structure which gives little internal reflection, by adjusting the reflective index, in order to prevent light emitted from the organic compound layer from being reflected by the polarization plate and returning to the inside.

Embodiment 4

An example of a passive matrix light emitting device is shown in Embodiment 4 as an example of a light emitting device disclosed by the present invention. Note that an example shown in here has a structure in which light emission is taken from the opposite side of the substrate. A top view thereof is shown in FIG. 9A, and a cross sectional diagram of FIG. 9A cut along a line P-P' is shown in FIG.

9B. In addition, as an element composition of the organic light emitting device, used here is a white light emitting element.

Figure 9A:
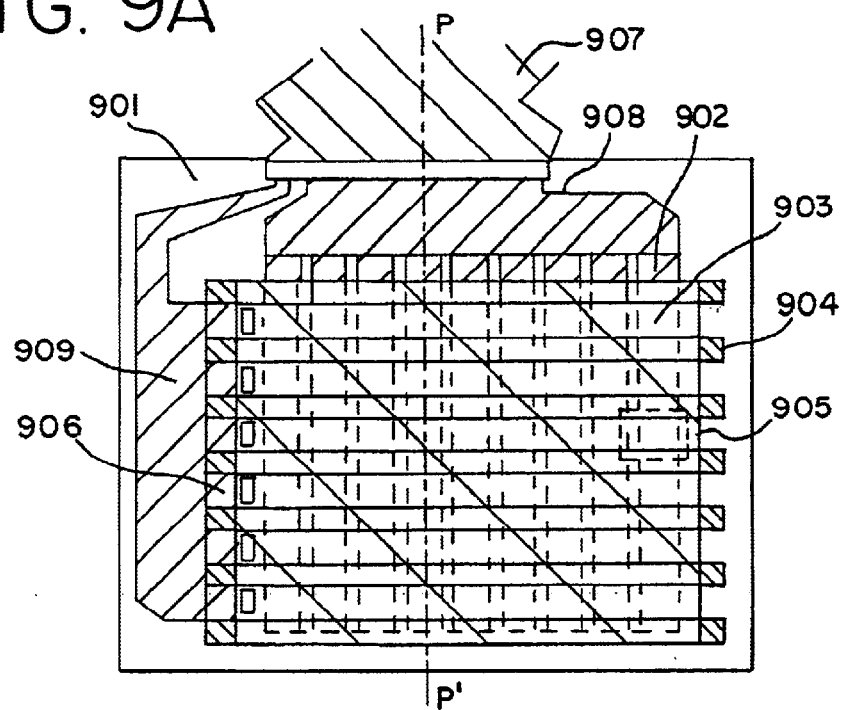
FIGS. 9A to 9C are diagrams illustrating the structure of a light emitting device.

Reference numeral 901 denotes a substrate in FIG. 9A, and glass material is used for the substrate here. A plastic material also can be used, as the plastic material, polyimide, polyamide, acrylic resin, epoxy resin, PES (polyethylene sulfone), PC (polycarbonate), PET (polyethylene terephthalate), or PEN (polyethylene naphthalate), which are in a plate shape, or a film shape can be used.

Reference numeral 902 denotes a scanning line (anode) made from an oxide conductive film, and TiN is used in Embodiment 4. Further, reference numeral 903 denotes a data line (cathode) made from a metallic film, and used in Embodiment 4 is one in which a semitransparent film of aluminum and barium fluoride are laminated and ITO is laminated thereon by sputtering. Emission is taken from a cathode side. Reference numeral 904 denotes a bank made from an acrylic resin, and the banks 904 function as partitions for separating the data lines 903. Pluralities of both the scanning lines 902 and the data lines 903 are formed in a stripe shape, and the scanning lines 902 and the data lines 903 are formed so as to mutually intersect at right angles. Note that, although not shown in the FIG. 9A, organic compound layers are sandwiched between the scanning lines 902 and the data lines 903, and intersecting portions 905 become pixels.

The scanning lines 902 and the data lines 903 are connected to an external driver circuit through a TAB tape 907. Note that reference numeral 908 denotes a wiring group in which the scanning lines 902 are aggregated, and that reference numeral 909 denotes a wiring group in which connection wirings 906 connected to the data lines 903 are aggregated. Further, although not shown in the figures, a TCP in which an IC is formed in a TAB tape may also be connected instead of the TAB tape 907.

Figure 9B:
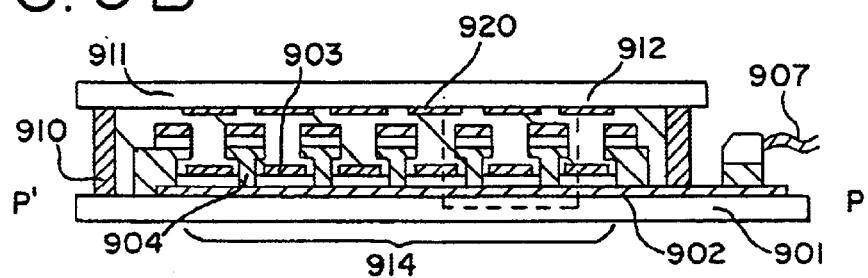

Reference numeral 910 denotes a sealant in FIG. 9B, and reference numeral 911 denotes a cover material bonded to the plastic substrate 901 by the sealant 910. A radiation cured resin may be used as the sealant 910, and it is preferable to use a material having little outgassing and a low hygroscopicity. It is preferable to use the same material as that of the substrate 901 for the cover material, and glass (including quartz glass) or a plastic can be used. Used here is glass. Reference numeral 920 denotes a color filter. Here an example of forming the color filter to the cover material 911 is shown.

Figure 9C:
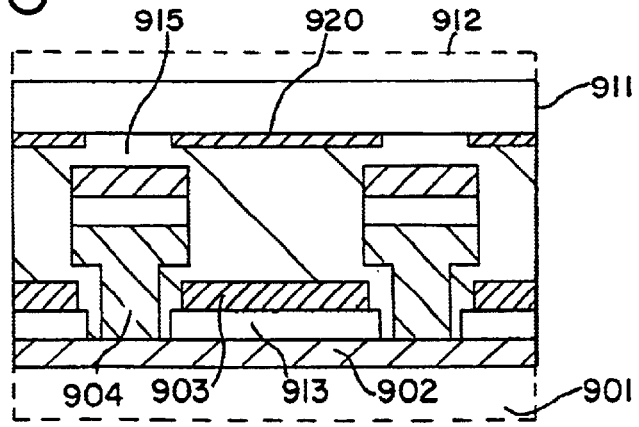

An enlarged diagram of the structure of a pixel region 912 is shown in FIG. 9C. Reference numeral 913 denotes an organic compound layer. Note that, as shown in FIG. 9C, the banks 904 have a shape in which the width of the lower side is narrower than the width of the upper side, and the data lines 903 are physically separated. Further, a pixel portion 914 enclosed by the sealant 910 is cut off from the atmosphere by a sealing material 915 made from a resin, thus forming a structure in which deterioration of the organic compound layers is prevented.

The pixel portion 914 is formed by the scanning lines 902, the data lines 903, the banks 904, and the organic compound layer 913 in the light emitting devices of the present invention made from the aforementioned structure, additionally, the organic compound layer may only emit white light, therefore, the manufacturing processes therefore can be made extremely simple.

Embodiment 5

The light emitting device of the present invention, which is described in the above embodiments has advantages of being excellent in yields and lifetimes. Thus, electronic devices including the light emitting device as display devices or the like can be the electronic devices being more durable than conventional devices.

Since the light emitting device is of self-luminescent type, a backlight needed in a liquid crystal display device is not required. Also, since a thickness of the organic compound film does not exceed 1 $\mu$m, thinness and weight reduction are allowed. Thus, an electronic device including the light emitting device as a display device or the like is thinner and lighter in weight as compared with a conventional device. In particular, electronic devices such as mobile devices are extremely effective, because thinness and light in weight directly leads to convenience (light and compact in portage). Further, with respect to electronic devices in general, there is no room for doubt that thinness (not bulk) is effective in view of transportation (mass transportation is allowed) and setting (saving of a space such as a room).

Also, since the light emitting device is of self-luminescent type, this light emitting device has higher visibility in a light place and a wider view angle, as compared with those of a liquid crystal display device. Therefore, the electronic devices including the light emitting device as a display portion has a large merit in view of display visibility.

To summarize, an electronic device that uses the light emitting device of the present invention has, in addition to merits of conventional organic light emitting devices, namely, a thinness/lightness and high visibility, new features of long lifetimes and excellent yields, and therefore are very useful.

In this embodiment, an example of electronic devices including the light emitting device of the present invention as a display portion will be described. Concrete examples are shown in FIGS. 10A to 11C. As the light emitting devicees included in the electronic devices of this embodiment, any one of the light emitting devicees disclosed in the present invention may be used. For example, the matrix display devices shown in Embodiments 3 and 4 may be used.

Figure 10A:
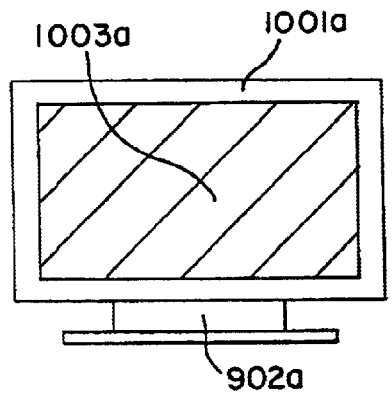
FIGS. 10A to 10F are diagrams illustrating specific examples of electric devices.

FIG. 10A shows a display device using the organic light emitting device including a casing 1001a, a support base 1002a, and a display portion 1003a. When a display in which the light emitting device of the present invention is used as the display portion 1003a is manufactured, a thin, lightweight display with long lifetime can be realized. Thus, not only the transportation is easy and saving the space at setting the display is allowed, but also the lifetime thereof is long.

Figure 10B:
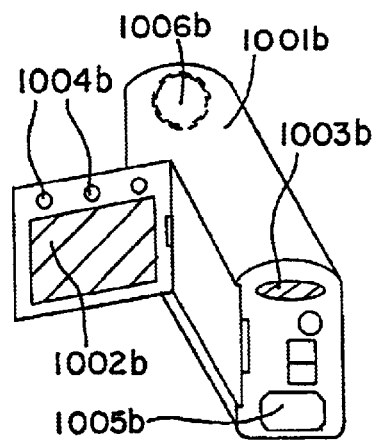

FIG. 10B shows a video camera including a main body 1001b, a display portion 1002b, a voice input portion 1003b, an operational switch 1004b, a battery 1005b, and an image receiving portion 1006b. When a video camera using the light emitting device of the present invention as the display portion 1002b is manufactured, a lightweight video camera with long lifetime can be realized.

Figure 10C:
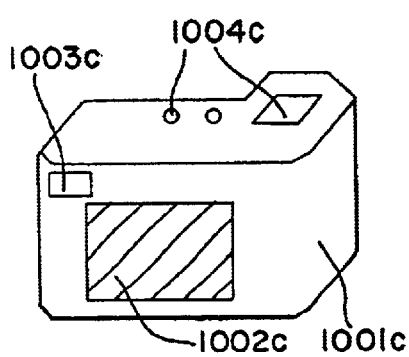

FIG. 10C shows a digital camera including a main body 1001c, a display portion 1002c, an eyepiece portion 1003c, and an operational switch 1004c. When a digital camera using the light emitting device of the present invention as the display portion 2202c is manufactured, a lightweight digital camera with long lifetime can be realized.

Figure 10D:
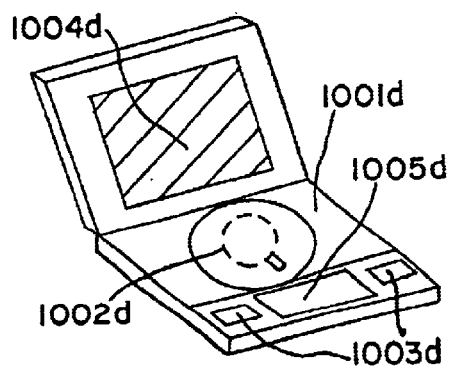

FIG. 10D shows an image reproduction device having a recording medium. The image reproduction device includes a main body 1001d, a recording medium (CD, LD, DVD, or the like) 1002d, an operational switch 1003d, a display portion (A) 1004d, and a display portion (B) 1005d. The display portion (A) 1004d displays mainly image information and the display portion (B) 1005d displays mainly character information. When the image reproduction device using the light emitting device of the present invention as these display portions (A) 1004d and (B) 1005d is manufactured, other than being lightweight, the above mentioned image reproduction device with long lifetime can be realized. Such image reproduction devicees having the recording medium include a CD reproduction device, a game machine, and the like.

Figure 10E:
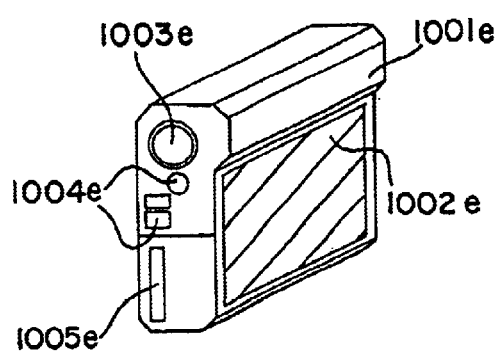
Figure 10F:
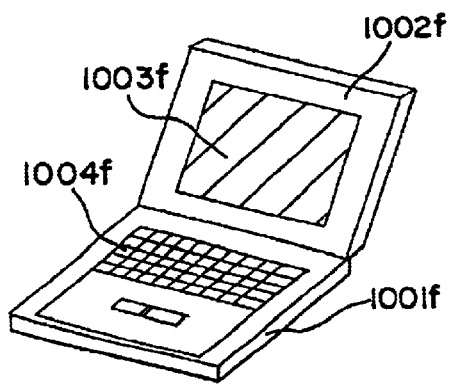

FIG. 10E shows a portable (mobile) computer including a main body 1001e, a display portion 1002e, an image receiving portion 1003e, an operational switch 1004e, and a memory slot 1005e. When a portable computer using the light emitting device of the present invention as the display portion 2202e is manufactured, a portable computer with long lifetime being thin and lightweight can be realized. This portable computer can record information in a recording medium into which a flash memory and a non-volatile memory are integrated and reproduce the information.

FIG. 1OF shows a personal computer including a main body 1001f, a casing 1002f, a display portion 1003f, and a keyboard 1004f. When a personal computer using the light emitting device of the present invention as the display portion 1003f is manufactured, a personal computer with long lifetime, being thin, and lightweight can be realized. In particular, when portage use is required as the case of a note personal computer, it is a large merit in the view of lightness.

In many cases, the above electronic devices display information distributed through an electronic communication line such as Internet and a radio communication such as radio wave. In particular, the case where moving image information is displayed is increased. The response speed of the organic fight emitting material is very high, and thus it is suitable for such moving image display.

Figure 11A:
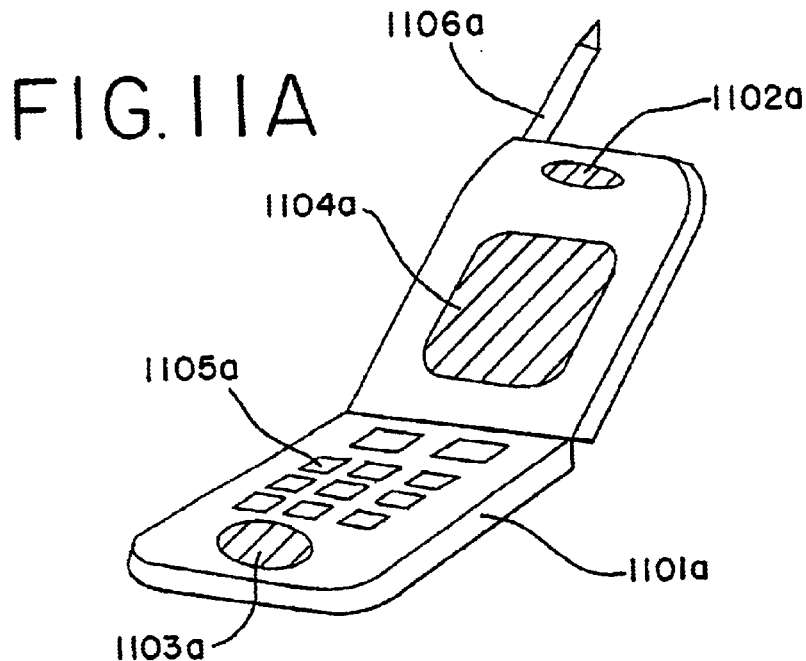
FIGS. 11A to 11C are diagrams illustrating specific examples of electric devices.

Next, FIG. 11A shows a mobile phone including a main body 1101a, a voice output portion 1102a, a voice input portion 1103a, a display portion 1104a, an operational switch 1105a, and an antenna 1106a. When a mobile phone using the light emitting device of the present invention as the display portion 1104a is manufactured, a mobile phone with long lifetime, being thin and lightweight can be realized.

Figure 11B:
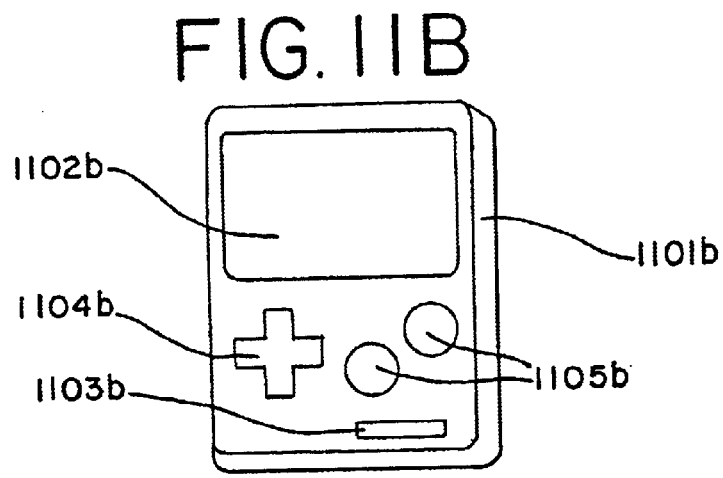

FIG. 11B shows a portable game machine including a main body 1101b, a display portion 1102b, a main power supply 1103b, operation switches 1104b and 1105b. When a portable game machine using the light emitting device of the present invention as the display portion 1102b is manufactured, a thin and lightweight game machine with long lifetime can be realized. In addition, a game machine usually requires an active moving image, the response speed of the organic light emitting device is very high, and thus it is suitable for such moving image display.

Figure 11C:
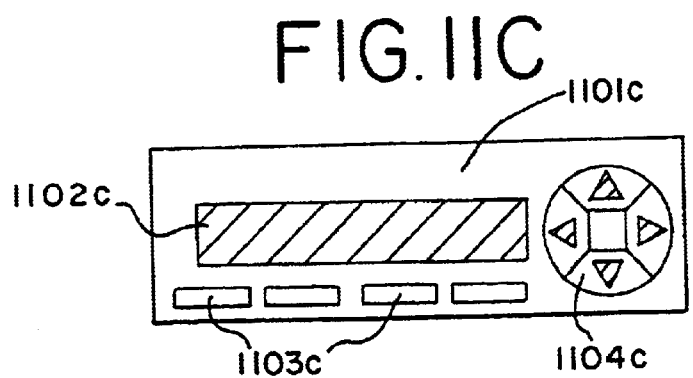

FIG. 11C shows an acoustic device (concretely, an in-car audio) including a main body 1101c, a display portion 1102c, and operational switches 1103c and 1104c. When an acoustic device using the light emitting device of the present invention as the display portion 1102c is manufactured, a lightweight acoustic device with long lifetime can be realized. However, in this embodiment, the in-car audio is described as an example. The light emitting device may also be used for a home audio.

With respect to the electronic devices as shown in FIGS. 10A to 11C, it is effective that a photo sensor is incorporated and a means for detecting luminance in an environment is provided and thus a function such as light emission luminance is modulated in accordance with the luminance in the environment is provided. If the luminance with a contrast ratio of 100 to 150 can be obtained as compared with the luminance in the environment, a user can recognize images or character information without causing a problem. That is, when the environment is light, the luminance of the images can be increased such that it is easy to view. On the other hand, when the environment is dark, the luminance of the images can be reduced and thus power consumption can be suppressed.

Also, since with capabilities of long lifetime, thinness, and weight reduction, various electronic devices using the light emitting device of the present invention as a light source is very useful. Typically, with respect to the electronic devices including the light emitting device of the present invention as a light source such as a back light or a front light of the liquid crystal display device or a light source of illumination devices.

Thus, even in the case where a liquid crystal display is used for all the display portions of the electronic devices which are described in this embodiment and shown in FIGS. 10A to 11C, when the electronic devices using the light emitting device of the present invention as the back light or the front light of the liquid crystal display is manufactured, an electronic device, not only being durable, but being thin and light weight, can be achieved.

The implementation of the invention can improve the alternating current drive method of the organic light emitting device capable of relaxing the luminance deterioration and preventing short circuits in the initial driving period more than before, and can prevent the device from being destroyed by dielectric breakdown in the long term. In addition, the alternating current drive means thus improved is combined with the organic light emitting device to provide a light emitting element with small luminance deterioration and excellent yields. Furthermore, the light emitting device is used to manufacture an electric device, which can provide an electric device more durable than before.

What is claimed is:

1. A light emitting device comprising:
    a light emitting element comprising:
        a first electrode;
        a second electrode; and
        a light emitting layer comprising an organic compound between the first and the second electrodes,
    wherein the light emitting element emits light by applying a voltage between the first electrode and the second electrode;
    means for applying a forward bias for emitting light from the organic light emitting element and a reverse bias of reverse polarity to the forward bias,
    wherein a maximum voltage Vf of the forward bias is higher than a maximum voltage Vr of the reverse bias in an alternating current cycle formed of the forward bias and the reverse bias.

2. A light emitting element comprising:
    a first electrode;
    a second electrode; and
    a light emitting layer comprising an organic compound between the first and the second electrodes,
    wherein the light emitting element emits light by applying a voltage between the first electrode and the second electrode;
    means for applying a forward bias for emitting light from the organic light emitting element and a reverse bias of reverse polarity to the forward bias,
    wherein a maximum voltage Vf of the forward bias is higher than a maximum voltage Vr of the reverse bias in an alternating current cycle formed of the forward bias and the reverse bias, and wherein the maximum voltage Vr of the reverse bias is a quarter of the maximum voltage Vf of the forward bias or higher.

3. A light emitting element comprising:

a first electrode;

a second electrode; and a light emitting layer comprising an organic compound between the first and the second electrodes, wherein the light emitting element emits light by applying a voltage between the first electrode and the second electrode;

means for applying a forward bias for emitting light from the organic light emitting element and a reverse bias of reverse polarity to the forward bias, wherein a maximum voltage Vf of the forward bias is higher than a maximum voltage Vr of the reverse bias in an alternating current cycle formed of the forward bias and the reverse bias, and wherein a period to apply the reverse bias in the alternating current cycle is equal to or longer than a period to apply the forward bias.

4. A light emitting device according to claim 1, wherein the organic light emitting device produces light emission from a triplet excited state.

5. A light emitting device according to claim 4, wherein the organic light emitting device produces light emission from a rare-earth metal ion.

6. A light emitting device according to claim 1, wherein both the forward bias and the reverse bias are applied so that a fixed voltage is applied to the organic light emitting device.

7. A light emitting device according to claim 1, wherein the forward bias is applied so that a fixed current is carried through the light emitting element, and the reverse bias is applied so that a fixed voltage is applied to the organic light emitting device.

8. A light emitting device according to claim 1, wherein the light emitting layer comprises a polymer compound for producing light emission.

9. A light emitting device according to claim 1, a conductive layer containing an inorganic compound is disposed between the light emitting layer and at least one of the first electrode and the second electrode.

10. A light emitting device according to claim 9, wherein a conductivity of the conductive layer containing the inorganic compound is $10^{-10}$ S/cm or higher.

11. The light emitting device according to claim 1, wherein a layer containing a conductive polymer compound is disposed between the light emitting layer and at least one of the first electrode and the second electrode.

12. The light emitting device according to claim 11, wherein the layer containing the conductive polymer compound further comprises one of an acceptor and a donor for the conductive polymer compound.

13. The light emitting device according to claim 11, wherein a conductivity of the layer containing the conductive polymer compound is $10^{-10}$ S/cm or higher.

14. The light emitting device according to claim 1, wherein a layer containing a Π-conjugated organic compound is disposed between the organic compound layer and at least one of the first electrode and the second electrode.

15. The light emitting device according to claim 14, wherein the layer containing the pi-conjugated organic compound further comprises one of an acceptor and a donor for the Π-conjugated organic compound.

16. The light emitting device according to claim 14, wherein a conductivity of the layer containing the Π-conjugated organic compound is $10^{-10}$ S/cm or greater.

17. An electric device using the light emitting device according to claim 1.

18. An electric device using the light emitting device according to claim 17, wherein the electric device is selected from the group consisting of a display device, a video camera, a digital camera, an image reproduction device, a portable computer, a personal computer, a mobile phone, a portable game machine and an acoustic device.

19. A light emitting device comprising:

a light emitting element comprising:
a first electrode;
a second electrode; and
a light emitting layer comprising an organic compound between the first and the second electrodes, wherein the light emitting element emits light by applying a voltage between the first electrode and the second electrode;

an alternator for applying a forward bias for emitting light from the organic light emitting element and a reverse bias of reverse polarity to the forward bias, wherein a maximum voltage Vf of the forward bias is higher than a maximum voltage Vr of the reverse bias in an alternating current cycle formed of the forward bias and the reverse bias.

20. A light emitting device comprising:

a light emitting element comprising:
a first electrode;
a second electrode; and
a light emitting layer comprising an organic compound between the first and the second electrodes, wherein the light emitting element emits light by applying a voltage between the first electrode and the second electrode;

an alternator for applying a forward bias for emitting light from the organic light emitting element and a reverse bias of reverse polarity to the forward bias, wherein a maximum voltage Vf of the forward bias is higher than a maximum voltage Vr of the reverse bias in an alternating current cycle formed of the forward bias and the reverse bias, and wherein a period to apply the reverse bias in the alternating current cycle is equal to or longer than a period to apply the forward bias.

* * * * *